(12) United States Patent
Fritz et al.

(10) Patent No.: US 6,949,404 B1
(45) Date of Patent: Sep. 27, 2005

(54) FLIP CHIP PACKAGE WITH WARPAGE CONTROL

(75) Inventors: Don Fritz, San Jose, CA (US); Wen-chou Vincent Wang, Cupertino, CA (US); Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 268 days.

(21) Appl. No.: 10/305,671

(22) Filed: Nov. 25, 2002

(51) Int. Cl.[7] .................. H01L 21/44; H01L 21/48; H01L 21/50
(52) U.S. Cl. ............... 438/106; 438/107; 438/108; 438/125
(58) Field of Search ............... 438/106, 107, 438/108

(56) References Cited

U.S. PATENT DOCUMENTS

| | | | | |
|---|---|---|---|---|
| 5,909,056 A | * | 6/1999 | Mertol | 257/704 |
| 6,091,603 A | * | 7/2000 | Daves et al. | 361/704 |
| 6,103,550 A | * | 8/2000 | Camenforte et al. | 438/107 |
| 6,262,489 B1 | * | 7/2001 | Koors et al. | 257/784 |
| 6,472,762 B1 | * | 10/2002 | Kutlu | 257/778 |
| 6,504,242 B1 | * | 1/2003 | Deppisch et al. | 257/707 |
| 6,617,683 B2 | * | 9/2003 | Lebonheur et al. | 257/707 |
| 6,744,132 B2 | * | 6/2004 | Alcoe et al. | 257/706 |
| 6,756,685 B2 | * | 6/2004 | Tao | 257/778 |
| 6,773,963 B2 | * | 8/2004 | Houle | 438/122 |
| 6,784,535 B1 | | 8/2004 | Chiu | |
| 2004/0016996 A1 | | 1/2004 | Tang | |
| 2004/0155358 A1 | | 8/2004 | Iijima | |
| 2004/0188862 A1 | | 9/2004 | Nagarajan et al. | |

OTHER PUBLICATIONS

U.S. Appl. No.: 10/719,451 filed on Nov. 20, 2003 entitled: *Structure And Material For Assembling A Low-K Sl Die To Achieve A low Warpage And Industrial Grade Reliability Flip Chip Package With Organic Substrate.*
U.S. Appl. No.: 10/849,651 filed May 19, 2004 entitled: *Low Stress And Warpage Laminate Flip Chip BGA Package.*

\* cited by examiner

*Primary Examiner*—Ha Tran Nguyen
*Assistant Examiner*—Angel Roman
(74) *Attorney, Agent, or Firm*—Beyer, Weaver & Thomas LLP

(57) ABSTRACT

Provided are a semiconductor flip chip package with warpage control and fabrication methods for such packages. The packages of the present invention include heat spreader lids that are rigidly attached to the die or packaging substrate with a bond that can withstand the considerable bowing pressures caused by the CTE mismatch between the die and substrate. The result is a package with less bowing and so improved co-planarity (in compliance with industry specifications) with the PCB board to which it is ultimately bound. Package reliability is thereby also enhanced, particularly for large die sizes.

23 Claims, 2 Drawing Sheets

FLIP CHIP PACKAGE WITH WARPAGE CONTROL

BACKGROUND OF THE INVENTION

This invention relates generally to semiconductor chip package assembly, and in particular to flip chip package assembly. More specifically, the invention relates to a flip chip package incorporating warpage control structures and methods of their assembly in a semiconductor flip chip package.

In semiconductor device assembly, a semiconductor chip (also referred to as an integrated circuit (IC) chip or "die") may be bonded directly to a packaging substrate, without the need for a separate leadframe or for separate I/O connectors (e.g., wire or tape). Such chips are formed with ball-shaped beads or bumps of solder affixed to their I/O bonding pads. During packaging, the chip is "flipped" onto its active circuit surface so that the solder balls form electrical connections directly between the chip and conductive pads or traces on a packaging substrate. Semiconductor chips of this type are commonly called "flip chips."

In a conventional method for packaging a semiconductor flip chip a semiconductor die and a packaging substrate are electrically connected and mechanically bonded in a solder joining operation. The die is aligned with and placed onto a placement site on the packaging substrate such that the die's solder balls are aligned with electrical pads or pre-solder on the substrate. The substrate is typically composed of an organic material or laminate. Heat is applied causing the solder balls to alloy and form electrical connections between the die and the packaging substrate. The package is then cooled to harden the connection.

An underfill is then applied in order to enhance the mechanical bonding of the die and substrate. An underfill material, typically a thermo-set epoxy, is dispensed into the remaining space (or "gap") between the die and the substrate. The underfill is then cured by heating and then cooling.

Semiconductor packages are typically subject to temperature cycling during normal operation. In order to improve the thermal performance and reliability of the packages, stiffeners and/or heat spreaders are often used. A stiffener may be placed around the die on the substrate where it is bonded with a heat curable organic adhesive. The stiffener (also sometimes referred to as a "picture frame") is typically a flat piece of high modulus metal about 10 to 40 mils thick, having substantially the same dimensions as the package substrate with a window in its center to clear the die. Typically, the stiffener is composed of nickel-plated copper which has a coefficient of thermal expansion similar to that of typical substrate materials. The stiffener is typically bonded in a separate step following curing of the underfill material. The purpose of the stiffener is to constrain the substrate in order to prevent its warpage or other movement relative to the die which may be caused by thermal cycling during operation of an electronic device in which the package is installed. Such movement may result from the different coefficients of thermal expansion (CTE) of the die and substrate materials, and may produce stress in the die or the package as a whole which can result in electrical and mechanical failures.

A heat spreader (also sometimes referred to as a "lid"), typically composed of a high thermal conductivity material, and having substantially the same dimensions as the package substrate is typically also attached over the stiffener and the die and bonded to the substrate by a thermally conductive organic adhesive. The heat spreader may have a hard or a soft connection with the die via a thermal compound, typically a thermal adhesive (die attach material) or grease, respectively. A conventional heat spreader is also typically a flat piece of the same type of material that is used for the stiffener, for example, nickel-plated copper about 20 to 40 mils thick. A heat spreader may also have a form that allows for direct attachment to the substrate, such as through edges or legs that descend from the flat piece overlying the die to contact the substrate. The heat spreader is usually applied in a separate step following attachment of the die and stiffener, if any. The purpose of the heat spreader is to disperse the heat generated during thermal cycling in order to reduce stress in the package due to different CTEs of the various elements of the package, including the die, substrate and underfill.

A problem with such flip chip package constructions is that during the cool down from the solder joining temperature, the whole package is highly stressed due to the different coefficients of thermal expansion (CTEs) of the substrate and die materials. Shrinkage of the substrate, typically an organic material having a CTE of about 17 ppm, is much more than that of the die, which typically is silicon-based and has a CTE of about 2–3 ppm, e.g., 2.6 ppm. The high stress experienced by these bonded materials during cooling may cause them to warp or crack and cause the package structure to bow. This problem is exacerbated in the case of a relatively large die, for example one 400 mm$^2$ or larger, attached to a relatively small substrate, for example, one 1600 mm$^2$ or smaller. In this case, the bow of the package may exceed the co-planarity specification for packaged flip chips.

FIG. 1 illustrates the problem of semiconductor flip chip package bow due to die/substrate CTE mismatch. A semiconductor flip chip package 100 having a die (flip chip) 102 and substrate 104 electrically connected by solder bumps 106 and mechanically reinforced by underfill 108 is shown. The package 100 also includes a heat spreader lid 112 in contact with the die 102 via a thermal compound 110, usually a grease, and bonded to the substrate 104 with an organic adhesive 114. As shown in FIG. 1, particularly with large die sizes, CTE mismatch between the die and the substrate leads to bowing 120 of the package. For example, in some instances, a substrate in such a package has been known to bow as much as 0.5 mm or more. This amount of bowing 120 exceeds industry specifications (JEDEC (e.g., MS-034), incorporated herein by reference) for the co-planarity required between package substrates and the printed circuit boards (PCBs) 116 to which they are to be attached (e.g., about 0.20 mm for MS-034) via a ball grid array (BGA) 116.

Accordingly, what is needed are flip chip packages and packaging methods that control package bow within acceptable limits for incorporation into electronic devices and to enhance package reliability, particularly for large die sizes.

SUMMARY OF THE INVENTION

To achieve the foregoing, the present invention provides a semiconductor flip chip package with warpage control and fabrication methods for such packages. The packages of the present invention include heat spreader lids that are rigidly attached to the die or to packaging substrate with a bond that can withstand the considerable bowing pressures caused by the CTE mismatch between the die and substrate. The result is a package with less bowing and so improved co-planarity (in compliance with industry specifications) with the PCB board to which it is ultimately bound. Package reliability is thereby also enhanced, particularly for large die sizes.

A variety of strategies are used in conjunction with the rigid connection of the lid in accordance with the invention. In one instance, the heat spreader may be composed of a thermally conductive material with a CTE balanced with that of the substrate. This lid is rigidly connected to the inactive side of the die to provide a substantially symmetrical application of bowing force (at least sufficiently symmetrical to bring the bow of the package within the tolerance of the industry specification) on opposite sides of the die. The symmetrical forces effectively cancel each other reducing or eliminating the bow normally generated by die/substrate CTE mismatch.

In another instance, the heat spreader may be composed of a thermally conductive material pre-stressed to balance the bowing force caused by the CTE mismatch. This lid is rigidly connected to the inactive side of the die to provide a substantially symmetrical application of bowing force (at least sufficiently symmetrical to bring the bow of the package within the tolerance of the industry specification) on opposite sides of the die. The pre-stress of the lid material may be achieved in a variety of ways including cold rolling of a metal or the use of a composite of two bonded materials having different coefficients of thermal expansion with the material having a higher coefficient of thermal expansion being bonded to the die. Again, the symmetrical forces applied on either side of the die effectively cancel each other reducing or eliminating the bow normally generated by die/substrate CTE mismatch.

In another instance, the heat spreader lid may be composed of a thermally conductive material that is rigidly connected to the substrate so as to constrain the bowing of the package. This lid is rigidly connected to the die side of the substrate with a high shear strength adhesive. In this instance, the lid may have a variety of compositions. For example, it may be a unitary piece composed of a conventional heat spreader material, such as copper. Alternatively, it may be composed of a plurality of materials selected for their specific CTE and modulus. For example, it may be composed of a stiffener made of a material selected to more closely match the CTE of the underlying organic substrate to which it is rigidly bound, such as copper, and a heat spreader made of a material with a CTE greater than that of the substrate, such as aluminum. Such a structure not only constrains the bowing of the package by way of the high strength bonding to the substrate, but also balances the lower CTE of the die in some measure so as to counter the bowing force caused by the die/substrate CTE mismatch and reduce the bowing trend.

In one aspect, the invention relates to a method of assembling a semiconductor die with a packaging substrate. The method involves providing a flip chip die having active and inactive surfaces and a packaging substrate having die and board surfaces, solder joining the active surface of the die and the die surface of the substrate; and rigidly connecting a heatspreader and/or a stiffener to one of the inactive surface of the die and the die surface of the substrate to form a semiconductor package so that warpage of the package is controlled by the heatspreader and/or stiffener.

In another aspect, the invention relates to a semiconductor die package. The package includes a package substrate having a die surface, a board surface, and a first coefficient of thermal expansion, a flip chip die having an active surface, an inactive surface, and a second coefficient of thermal expansion less than the first coefficient of thermal expansion, and a heatspreader and/or stiffener rigidly connected to one of the inactive surface of the die and the die surface of the substrate to form a semiconductor package so that warpage of the package is controlled by the heatspreader and/or stiffener.

These and other features and advantages of the present invention are described below where reference to the drawings is made.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

When used in combination with "comprising," "a method comprising," "a device comprising" or similar language in this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The present invention provides a semiconductor flip chip package with warpage control and fabrication methods for such packages. Conventional package constructions are inadequate to prevent bowing of packages containing large dies beyond the co-planarity tolerances of the industry standards. The packages of the present invention include heat spreader lids that are rigidly connected to the die or packaging substrate with a bond that can withstand the considerable bowing pressures caused by the CTE mismatch between the die and substrate. The remaining connection of the heat spreader lid to the substrate or die is a lower modulus connection allowing sufficient flexibility to absorb the inherent stresses of the CTE mismatch without causing the die to delaminate or crack. The result is a package with less bowing and so improved co-planarity (in compliance with industry specifications) with the PCB board to which it is ultimately bound. Package reliability is thereby also enhanced, particularly for large die sizes.

Figure 1:
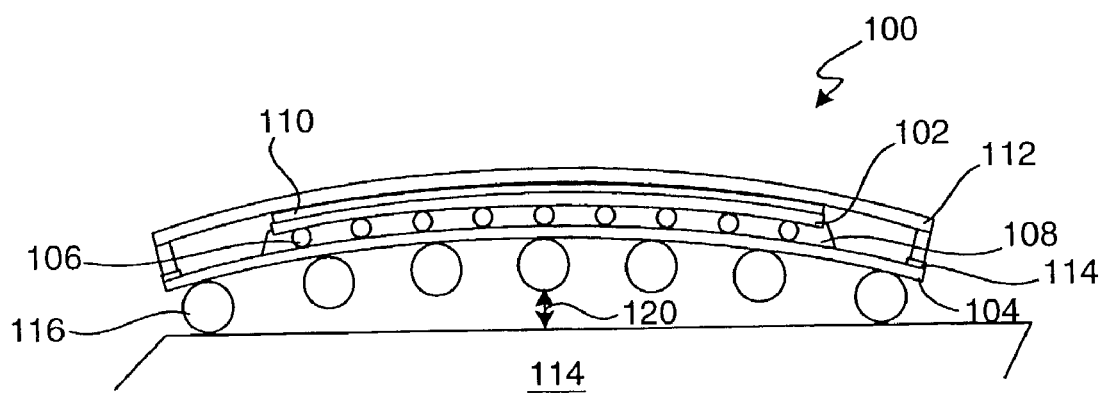
FIG. 1 depicts a cross-sectional view of a semiconductor flip chip package bowed outside the tolerance of industry specifications due to CTE mismatch between the die and substrate.
Figure 2:
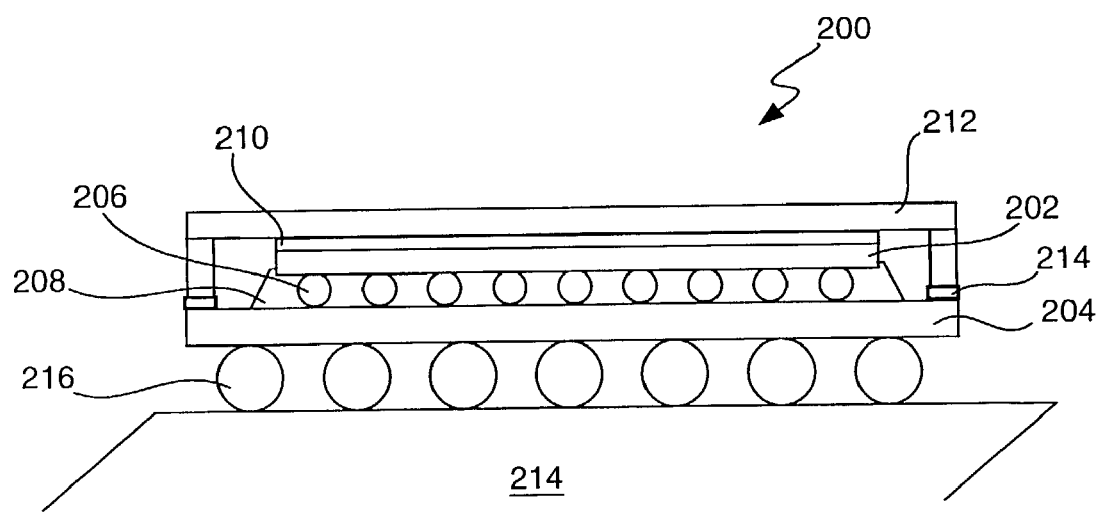
FIG. 2 depicts a cross-sectional view of a semiconductor flip chip package with warpage control in accordance with various embodiments of the present invention.

A variety of strategies are used in conjunction with the rigid connection of the lid in accordance with the invention. Specific embodiments of the present invention are illustrated and described with reference to FIG. 2. A semiconductor flip chip package 200 having a die (flip chip) 202 and substrate 204 electrically connected by solder bumps 206 is shown. The die 202 may have dimensions on the order of about 25–900 mm$^2$. The invention is particularly advantageously applied to packages having a large die size, for example, 400 mm$^2$ or larger (e.g., 20×23 mm, 23×28 mm or 26×32 mm), attached to a relatively small substrate, for example, one 1600 mm$^2$ or smaller of (e.g., 33×33 mm, 33×35 mm or 40×40 mm).

The flip chip die 202 and packaging substrate 204 are electrically connected and mechanically bonded in a solder joining operation. The unbonded flip chip has an array of solder balls or bumps arranged on its active circuit surface. The solder is generally composed of a eutectic material having a melting point of about 180° C. or a higher melting lead material, having a melting point of about 300° C., for example.

Prior to bonding the die to a substrate, solder flux is applied to either the active surface of the die or the packaging substrate surface. The flux serves primarily to aid the flow of the solder, such that the solder balls make good contact with traces on the packaging substrate. It may be applied in any of a variety of methods, including brushing or spraying, or dipping the die into a thin film, thereby coating the solder balls with flux. The flux generally has an acidic component, which removes oxide barriers from the solder surfaces, and an adhesive quality, which helps to prevent the die from moving on the packaging substrate surface during the assembly process. Non-cleaning or high temperature cleaning fluxes, as are known in the art, may be used.

After the flux is applied, the die is aligned with and placed onto a placement site on the packaging substrate such that the die's solder balls are aligned with electrical traces on the substrate. The substrate 204 is typically composed of a an organic or laminate material, such as fiber glass, PTFE (such as Teflon™, available form Gore, Eau Claire, Wis.) bismaleimide triazine (BT) resin, epoxy laminates or ceramic-plastic composites. Heat, typically above 200° C., is applied to one or more of the die and the packaging substrate, causing the solder balls 206 to alloy and form electrical connections between the die 202 and the packaging substrate 204. The package is then cooled to harden the connection. Then, where necessary, the remaining flux residue is substantially removed in a cleaning step, for instance by washing with an appropriate solvent.

An underfill is also be applied in order to enhance the mechanical bonding of the die and substrate. In one embodiment, an underfill material, typically a thermo-set epoxy, such as is available from Hysol Corporation of Industry, California (e.g., product numbers 4549, 8439), Ablestik Laboratories of Rancho Domingo, Calif., or Namics, Reno, Nev. (e.g., product no. 8439-1) is dispensed into the remaining space (or "gap") between the die and the substrate. The underfill is selected to complement the other bonding materials used to attach the die and heat spreader lid the substrate. In a typical procedure, a bead of thermo-set epoxy, is applied along one edge of the die where it is drawn under the die by capillary action until it completely fills the gap between the die and the packaging substrate. Slight heating of the packaging substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any underfill application may be used in conjunction with the present invention.

The underfill 208 is cured by heating the substrate and die to an appropriate curing temperature for the underfill material, generally about 150° C., and curing for a specific amount of time at temperature, and then cooling. In this manner the process produces an electrically and mechanically bonded semiconductor chip assembly, with the underfill material allowing a redistribution of the stress at the connection between the die and the substrate from the solder joints only to the entire sub-die area.

In accordance with the present invention, a conventional stiffener/heat spreader construction is replaced by the application of a warpage control structure formed by a heat spreader or stiffener/heat spreader combination having particular composition and physical connection with the die and/or substrate. The warpage control may be accomplished in a variety of ways.

The package 200 includes a heat spreader lid 212 composed of a high modulus, thermally conductive material with a CTE balanced with that of the substrate 204. The lid material is composed of a high modulus (e.g., about 60 to 200 Gpa), high thermal conductivity (e.g., about 2 to 4 W/cm-K) material, having substantially the same dimensions as the package substrate. The lid material is selected to have a CTE the same as or sufficiently similar to the substrate to apply a counter stress to the die to reduce the bow of the package 200 to bring it within the tolerance of the industry specification (about 0.20 mm). Typical substrate materials have CTEs in the range of about 15–20 ppm, therefore the lid should have a CTE in this range. Moreover, the lid material should have a modulus of elasticity and thickness to balance that of the substrate. Examples of suitable materials include copper; nickel-plated copper; aluminum; and copper alloys (such as Olin194 (ASTM Spec. No. B465), available from Olin Brass, East Alton, Ill.), each with a thickness selected to achieve a balance with the force applied to the active side of the die 202 by the substrate 204. A heat spreader lid may be composed of a heat spreader connected to the substrate via a stiffener or may also have a form that allows for direct attachment to the substrate, such as through edges or legs that descend from the flat piece overlying the die to contact the substrate. In either case, it is referred to herein as a heat spreader lid.

This lid 212 is rigidly connected to the inactive side of the die 202 so as to provide a symmetrical application of bowing force on opposite sides of the die, at least sufficiently symmetrical to bring the bow of the package 200 within the tolerance of the industry specification (about 0.20 mm). The lid is attached at an elevated temperature in the cycling experienced by the package during its fabrication and/or operation so that the bowing force resulting from the die/substrate CTE mismatch, which is generally experienced during cool down from the die attachment operations, is balanced during cooling, and bowing is thereby prevented or reduced. In a preferred embodiment, following attachment of the die 202, the package is heated to a temperature sufficient to relieve bowing pressure caused by the CTE mismatch between the die and the substrate. Optimally, the heating will be sufficient so that the package becomes flat, but at a minimum, the bowing should be within the JEDEC standards for the package type. The temperature should also be above the curing temperature of the adhesive to be used to rigidly attach the lid 212 to the die 202. A typical temperature is between about 150 and 165° C.

The rigid connection is provided via a high thermal conductivity, high modulus and shear strength adhesive 210 that creates a strong, hard joint between the lid 212 and the inactive surface of the die 202. Suitable adhesives include thermal polymers with shear strengths in excess of 3000 psi lap shear, or at least 5500 psi lap shear, with a glass transition temperature ($T_g$) above 100° C. For example, silver loaded die attach materials, such as QMI-595 die attach adhesive material available from Hysol Corporation of Industry, California or product JM2500, available from Honeywell, Morristown, N.J. may be used.

The lid 212 is also connected to the substrate, optionally via a stiffener. The connection of the lid 212 to the substrate (and optionally the stiffener) is made with an adhesive 214. Where the lid is rigidly connected to the die, the connection to the substrate has a lower modulus to allow for some flexibility in the overall connection between the die and substrate. This combination of a high and low modulus connections of the die 202, substrate 204 and lid 212 allows for sufficient flexibility to accommodate the inherent stresses of the CTE mismatch (thereby reducing the risk of delamination and cracking of the die) while applying appropriate force to prevent bowing of the package outside the industry specifications. Suitable low modulus adhesives for this purpose are silicone-based adhesives.

In this design, the symmetrical forces effectively cancel each other reducing or eliminating the bow normally generated by die/substrate CTE mismatch. As a result, the package 200 may be more reliably connected to a printed circuit board 214 via a ball grid array (BGA) 216.

In another instance, the lid 212 may be composed of a thermally conductive material pre-stressed to balance the bowing force caused by the die/substrate CTE mismatch. Again, this lid is rigidly connected, for example with a high shear strength adhesive as described above, to the inactive side of the die to provide a symmetrical (at least sufficiently symmetrical to bring the bow of the package within the tolerance of the industry specification) application of bowing force on opposite sides of the die. The pre-stress of the lid material may be achieved in a variety of ways. A unitary metal material, such as copper or aluminum, may be cold rolled so that it acquires a bowing force opposite that generated by the die/substrate CTE mismatch.

Alternatively, the lid 212 may be a composite of two bonded materials having different coefficients of thermal expansion with the material having a higher coefficient of thermal expansion being bonded to the die (e.g., a Dumet-type structure or a bimetal laminate). Again, the materials are selected and arranged such that symmetrical bowing forces effectively cancel each other reducing or eliminating the bow normally generated by die/substrate CTE mismatch. A suitable higher CTE material may be, for example, aluminum, and a suitable lower CTE material may be, for example, copper.

In another instance, the lid 212 may be composed of a high modulus, thermally conductive material that is rigidly connected to the die side of the substrate with solder or a high shear strength adhesive, as described above, but has a lower modulus hard connection (i.e., using a lower modulus and shear strength adhesive) or a soft connection (i.e., via thermal grease) to the inactive side of the die 202. Suitable high modulus, high shear strength adhesives for attachment of the lid to the substrate include Ablestik 3003, Ablebond 789 and Ablefilm 550, all available from Ablestik Laboratories of Rancho Domingo, California. A suitable low modulus adhesive may have a modulus of about 4–5 Gpa and a glass transition temperature (TG) of about 70° C., for example product no. 8439-1, available from Namics, Reno, Nev.

In this embodiment, the lid 212 may have also a variety of compositions. For example, it may be a unitary piece composed of a conventional heat spreader material, such as copper, aluminum, etc. Alternatively, the lid 212 may be composed of a plurality of materials selected for their specific CTE and modulus. For example, it may be composed of a stiffener made of a material selected to more closely match the CTE of the underlying organic substrate to which it is rigidly bound, such as copper, and a heat spreader made of a material with a CTE greater than that of the substrate, such as aluminum. Such a structure not only constrains the bowing of the package by way of the high strength bonding to the substrate, but also balances the lower CTE of the die in some measure so as to counter the bowing force caused by the die/substrate CTE mismatch and reduce the bowing trend.

As with the previously described embodiments, the rigid, high shear strength attachment is made at an elevated temperature in the cycling experienced by the package during its fabrication and/or operation so that the bowing force resulting from the die/substrate CTE mismatch, is balanced during cooling, and bowing is thereby prevented or reduced. In a preferred embodiment, following attachment of the die 202, the package is heated to a temperature sufficient to relieve bowing pressure caused by the CTE mismatch between the die and the substrate. Optimally, the heating will be sufficient so that the package becomes flat, but at a minimum, the bowing should be within the JEDEC standards for the package type. The temperature should also be above the curing temperature of the adhesive to be used to rigidly attach the lid 212 to the substrate 204. A typical temperature is between about 150 and 165° C.

EXAMPLE

The following example provides details concerning semiconductor flip chip packages with warpage control in accordance with one embodiment of the present invention. It should be understood the following is representative only, and that the invention is not limited by the detail set forth in this example.

A multilayer organic (BT) package having a surface preparation including a solder mask material, and pre-applied solder surfaces to enhance the mounting of the chip to the package was provided. The die was position in registration to the pads of pre-applied eutectic solder (63/37 PbSn) and subjected to a thermal excursion above 200° C. to reflow the eutectic solder to the high lead (95/5 PbSn) solder bumps on the die. The die was then underfilled with a low modulus thermoset material (Namics 8439-1), which had suitable thermal characteristics to improve the thermal cycling reliability of the solder bumps of the attached chip. After underfill, a suitable window frame composed of copper, with or without surface treatment, was attached to the substrate on the die side with high shear strength adhesive Ablebond 550. Copper was chosen for the window frame material, since it more closely matches the CTE of the organic package material and thus does not cause high stresses between the window frame and the substrate. Window frame dimensions were selectively chosen so that the die is recessed below the level of the window frame. This was done so as to apply a very low modulus material between the chip and the heat spreader forming the lid for maximum thermal dissipation.

A very low modulus thermal material (Gelease MG-120) was selected for establishing a thermal path between the die and the heat spreader, to eliminate thermal stresses between the chip and the heat spreader. A heat spreader material was chosen which purposely had a higher CTE than the substrate and once attached to the substrate at elevated temperature (i.e., 150–165° C.) caused the surface to bow back in the opposite direction. High shear strength adhesive was also chosen to attach the heat spreader to the window frame to absorb the stresses caused by the slight mismatch of the material CTEs between the copper window frame and the substrate. The heat spreader was made of aluminum, with or without surface treatment to enhance serviceability, which has a CTE of 23.8 ppm. This CTE mismatch between the heat spreader and the substrate caused to substrate to bow in the reverse direction. This package structure results in a 33 mm package, with a bow of less that 0.10 mm. A similarly constructed 40 mm package bows less than 0.20 mm. Both packages have a co-planarity within the 0.20 mm tolerance of the JEDEC specification MS-034.

CONCLUSION

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method of assembling a semiconductor die with a packaging substrate, comprising
    providing a flip chip die having active and inactive surfaces and a packaging substrate having die and board surfaces;
    electrically and mechanically connecting the active surface of the die and the die surface of the substrate; and
    rigidly connecting a heat spreader lid to one of the inactive surface of the die and the die surface of the substrate to form a semiconductor package, wherein the rigid connection has a shear strength of at least 3000 psi lap shear;
    whereby warpage of the package is constrained by the heat spreader lid.

2. The method of claim 1, wherein the rigid connection is between the heat spreader lid and the die and a lower modulus connection is made between the heat spreader and the substrate.

3. The method of claim 2, wherein the heat spreader lid is a sheet of material having substantially the same coefficient of thermal expansion as the substrate and is rigidly connected to the inactive surface of the die.

4. The method of claim 3, wherein the substrate comprises BT and the heat spreader lid comprises copper.

5. The method of claim 2, wherein the lower modulus connection is made with a silicone based material.

6. The method of claim 1, wherein the rigid connection is between the heat spreader lid and the substrate and a lower modulus or soft connection is made between the heat spreader lid and the die.

7. The method of claim 6, wherein the heat sink to substrate bond has a shear strength of at least 3000 psi lap shear and a glass transition temperature of at least 100° C.

8. The method of claim 7, wherein the rigid connection has a shear strength of about 5500 psi lap shear.

9. The method of claim 7, wherein the heat spreader lid comprises a heat spreader and a stiffener, and the heat spreader and stiffen are comprised of the same material selected from the group consisting of copper, aluminum and nickel-plated copper, and are bonded to each other and the substrate by eutectic solder or silver loaded die attach material.

10. The method of claim 7, wherein the heat spreader lid comprises a heat spreader and a stiffener, and the heat spreader is comprised of material having a higher coefficient of thermal expansion than the substrate and the stiffener is comprised of a material having a coefficient of thermal expansion between that of the substrate and that of the heat spreader, and the heat spreader lid and stiffener are bonded to each other and the substrate by eutectic solder or silver loaded die attach material.

11. The method of claim 10, wherein the heatspreader is aluminum and the stiffener is copper.

12. The method of claim 6, wherein the lower modulus connection is made with a silicone based material.

13. The method of claim 1, wherein the rigid connection has a glass transition temperature of at least 100° C.

14. The method of claim 13, where the rigid connection has a shear strength of about 5500 psi lap shear.

15. The method of claim 1, wherein the rigidly connecting is conducted at elevated temperature sufficient that CTE mismatch bowing of the package is within 0.20 mm.

16. The method of claim 15, wherein the temperature is such that the package is substantially flat.

17. The method of claim 15, wherein the temperature is between about 150 and 165° C.

18. The method of claim 15, wherein the rigidly connecting is conducted at elevated temperature sufficient that CTE mismatch bowing of the package is within 0.10 mm.

19. The method of claim 1, wherein the die has dimensions of about 25–900 mm$^2$.

20. The method of claim 1, wherein the die has dimensions of at least about 400 mm$^2$.

21. The method of claim 20, wherein the substrate has dimensions of no more than about 1600 mm$^2$.

22. A method of assembling a semiconductor die with a packaging substrate, comprising:
    providing a flip chip die having active and inactive surfaces and a packaging substrate having die and board surface;
    electrically and mechanically connecting the active surface of the die and the die surface of the substrate; and
    connecting a heat spreader lid to the inactive surface of the die and to the die surface of the substrate to form a semiconductor package, wherein a rigid connection is made between the heat spreader lid and the inactive surface of the die and a lower modulus connection is made between the heat spreader and the die surface of the substrate, wherein the heat spreader lid is a sheet of material pre-stressed to balance a warpage force of the substrate;
    whereby warpage of the package is constrained by the heat spreader lid.

23. The method of claim 22, wherein the heat spreader lid material is pre-stressed by a technique selected from the group consisting of cold rolling and use of a composite of two bonded materials having different coefficients of thermal expansion with the material having a higher coefficient of thermal expansion being bonded to the die.

* * * * *